219-121 SR
7/4/78 XR 4,099,062

United States Patent [19]
Kitcher

[11] 4,099,062
[45] Jul. 4, 1978

[54] ELECTRON BEAM LITHOGRAPHY PROCESS

[75] Inventor: James Robert Kitcher, Poughkeepsie, N.Y.

[73] Assignee: International Business Machines Corporation, Armonk, N.Y.

[21] Appl. No.: 754,310

[22] Filed: Dec. 27, 1976

[51] Int. Cl.[2] ..... A61K 27/02
[52] U.S. Cl. ..... 250/492 A; 219/121 EM
[58] Field of Search ..... 250/492 A, 492 R; 219/121 EM

[56] References Cited

U.S. PATENT DOCUMENTS

| | | | |
|---|---|---|---|
| 3,644,700 | 2/1972 | Kruppa et al. | 250/492 A |
| 3,866,013 | 2/1975 | Ryan | 219/121 EM |

*Primary Examiner*—Harold A. Dixon
*Attorney, Agent, or Firm*—David M. Bunnell

[57] ABSTRACT

In an electron beam lithography process, shapes are formed which differ from the beam spot size and the grid by employing multiple overlapping exposures having a reduced exposure level.

3 Claims, 4 Drawing Figures

1 #2
3 #4

ELECTRON BEAM LITHOGRAPHY PROCESS

BACKGROUND OF THE INVENTION

This invention relates generally to the preparation of resist masks and more particularly to an electron beam lithography process.

Scanning, focussed electron beam systems such as are described, for example, in U.S. Pat. Nos. 3,644,700; 3,866,013 and 3,949,228 step an electron beam from one predetermined position to another to form an exposed pattern in a layer of radiation sensitive resist. The beam is preferably square-shaped and has a spot size equal to the minimum line width of the pattern which is to be formed. The beam is stepped across the surface of the resist in a raster fashion with the beam being blanked out where no exposure is desired. U.S. Pat. Nos. 3,866,013 and 3,949,228 describe a system which provides the capability of varying the time that the beam is turned on while it is at a given location. The stated purpose is to avoid over-exposure when the resist is over a material such as gold, which has a higher electron reflectivity than, for example, silicon or when a pattern line having a width equal to two spots of the beam is being formed. In the latter case, the developed shape will have a width greater than the width of two spots unless the exposure is reduced.

These exposure systems provide a stepping grid which is a fraction, for example one fourth, of the beam width. Shapes which are not even multiples of the beam spot size are formed by stepping the beam, with overlapping exposures, such that the total shape area desired is exposed.

Because the writing time of the pattern consumes a major portion of the resist mask formation process, it is desirable to have as large a beam or spot size as possible particularly when a large portion of the pattern is to be exposed. One constraint has been the need to have a beam size which is the width of the narrowest shape to be exposed. The choice of shapes is also limited to the stepping grid. A process has now been found which produces shape sizes which vary from the stepping grid and which can be smaller than the width of the beam.

BRIEF SUMMARY OF THE INVENTION

In accordance with this invention, in a process for forming a patterned resist image on a substrate, in which a layer of resist material which becomes more soluble in a developer when struck by electrons is formed on a substrate and is exposed to a scanning beam of electrons to form a pattern of exposed shapes which are then developed by removing the exposed material with a developer to form a pattern of developed shapes, the scanning beam having a fixed spot size which is moved step-wise on a two-dimensional grid whose grid size is a fraction of the spot size; the improvement which comprises forming in said pattern of developed shapes, special shapes which do not coincide with the grid by multiple, overlapping exposures each of which provides a reduced exposure dosage such that only a portion of the exposed shape is removed by the developer.

DETAILED DESCRIPTION

Figure 1:
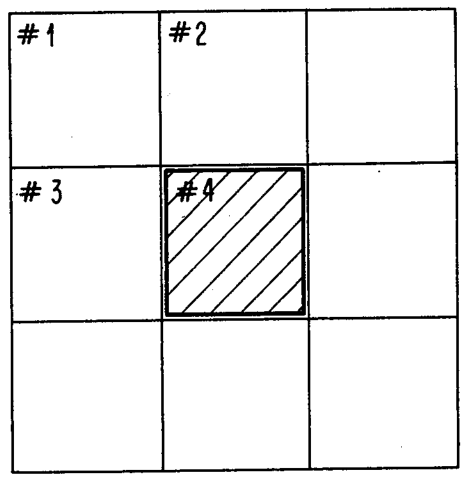
FIG. 1 is a diagram illustrating an exposure pattern for forming a shape which is smaller than the beam size.

Suitable systems for carrying out the process of the invention are described, for example, in U.S. Pat. Nos. 3,644,700 and 3,866,013 whose teachings are hereby incorporated by reference.

The process of the invention can be applied to forming resist patterns on various substrates where ultra fine image patterns are desired. The electron beam lithography process is particularly useful in forming high resolution resist patterns such as are employed in integrated circuit manufacture which is the application to which the examples of the specification are directed. In this process a layer of radiation sensitive resist material is employed such as, for example, a polysulfone, for example an olefin-sulfone polymer; vinyl type polymers and copolymers, for example, those derived from lower alkyl esters of methacrylic acid such as are described for example in U.S. Pat. Nos. 3,535,137 and 3,987,215; and a mixture of an alkali soluble resin and an orthoquinone diazide material, for example, a mixture of a phenol-formaldehyde novolak resin and 2-diazo-1-oxonaphthalene sulfonic acid esters of phenolic compounds.

Conventionally a solvent mixture of the resist material is coated onto the substrate, such as a semiconductor wafer and baked to remove the solvent. The resist coated substrate is then placed in the electron beam exposure apparatus and the resist is exposed by stepping a focused electron beam from one predetermined position to another in a line-by-line scan to form the desired exposed resist pattern as described, for example, in U.S. Pat. No. 3,866,013. The beam generally has an energy ranging from about 3 to 50 kv with exposure times at each exposure locations sufficient to provide from about 3 to 30 micro coulombs/$^2$cm of dosage depending upon the sensitivity of the particular resist material which is employed. The beam preferably has a square-shape and is stepped on a grid which is a fraction of the beam size so that shapes which are not as coarse as the beam size can be written by stepping the beam to successive locations which are, for example, $\frac{1}{4}$, $\frac{1}{2}$ or $\frac{3}{4}$ of the beam width both forward, backward and to the right or left. For example a square beam size of 2.5 microns stepped on a 0.625 micron grid. The time that the beam is on at any location can be varied to vary the exposure doage. The size of the beam in the systems described, for example, in U.S. Pat. Nos. 3,644,700 and 3,866,013 has been made equal to the minimum line width of the pattern which is to be formed.

According to the process of the invention developed resist image shapes which do not coincide with the grid and which can be less than the beam size are developed at the same time that normal shapes in the pattern are formed. This is accomplished by multiple overlapping exposures of certain shapes at a reduced exposure time so that different shapes in the exposed resist image receive different exposure dosages. Only a portion of the specially exposed shape areas are then removed by the developer during normal development of the image. Because of the electron beam scattering effect of the multiple exposures, it has been found that a gradation of pattern sizes can be produced by varying the exposure dosage used to form the special shapes.

After the exposure of the layer is completed, the resist layer is treated with a developer such as an organic solvent, or in the case of the novolak resin based resist an aqueous alkaline solution, which preferentially attacks the exposed portion of the layer to remove the resist material and expose a substrate in these areas thus forming a positive image. The substrate can then be subjected to an additive process such as metal deposition or ion implantation or a subtractive process such as etching, while the patterned resist layer protects the remainder of the substrate from the treatment.

The invention is further illustrated by, but is not intended to be limited to the following examples wherein parts are parts by weight unless otherwise indicated.

EXAMPLE 1

Clean dry silicon semiconductor wafers are coated with an approximately 1.3 micron thick layer of polymethyl methacrylate resist having a molecular weight, $M_w$, of about 400,000 by spin coating a 10% by weight solution of the polymer in ethyl cellosolve acetate at 2,000 rpm and then baking at 170° C for 30 minutes.

The resist layer is patternwise exposed to a scanning 25 kv electron beam which is 2.5 microns square. A developed shape of about 1.25 micron is achieved by exposing this shape as the intersection of 4 overlapping spot exposures of the 2.5 micron electron beam, i.e., as a 3.75 micron rectangle which is illustrated in FIG. 1. The four exposures in the figure are numbered 1–4 in the upper left hand corner of each spot and the 3.75 micron exposure shape is achieved by moving the spot on the grid ½ of the spot width to the right for exposure number 2, ½ of the spot width back to the left and ½ of the spot width down for exposure number 3, and then ½ of the spot width to the right for exposure number 4. The shaded area then normally would receive an exposure from all four spots so that at normal exposure time and dosage it would have four times the normal exposure dosage of about $1 \times 10^5$ coulombs/cm² of the rest of the pattern. Only the shaded area 1.25 micron square is developed during normal development of the remainder of the resist pattern by reducing the exposure of each of the four spots to about ¼ of the normal exposure time and then developing the exposed resist layer at 40° C in a 1:4 3-heptanone/hexyl acetate mixture for a time which produces normal development of the nominally or fully exposed shapes in the remainder of the pattern.

Figure 2:
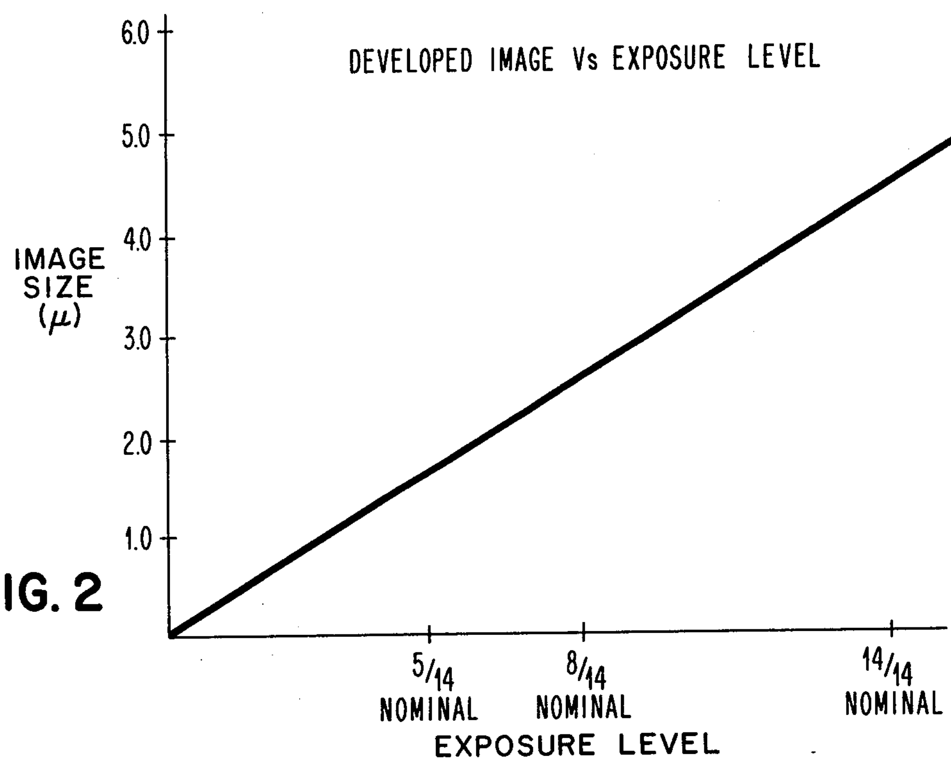
FIG. 2 is a graph illustrating developed image size versus exposed image size for different exposure levels.
Figure 3:
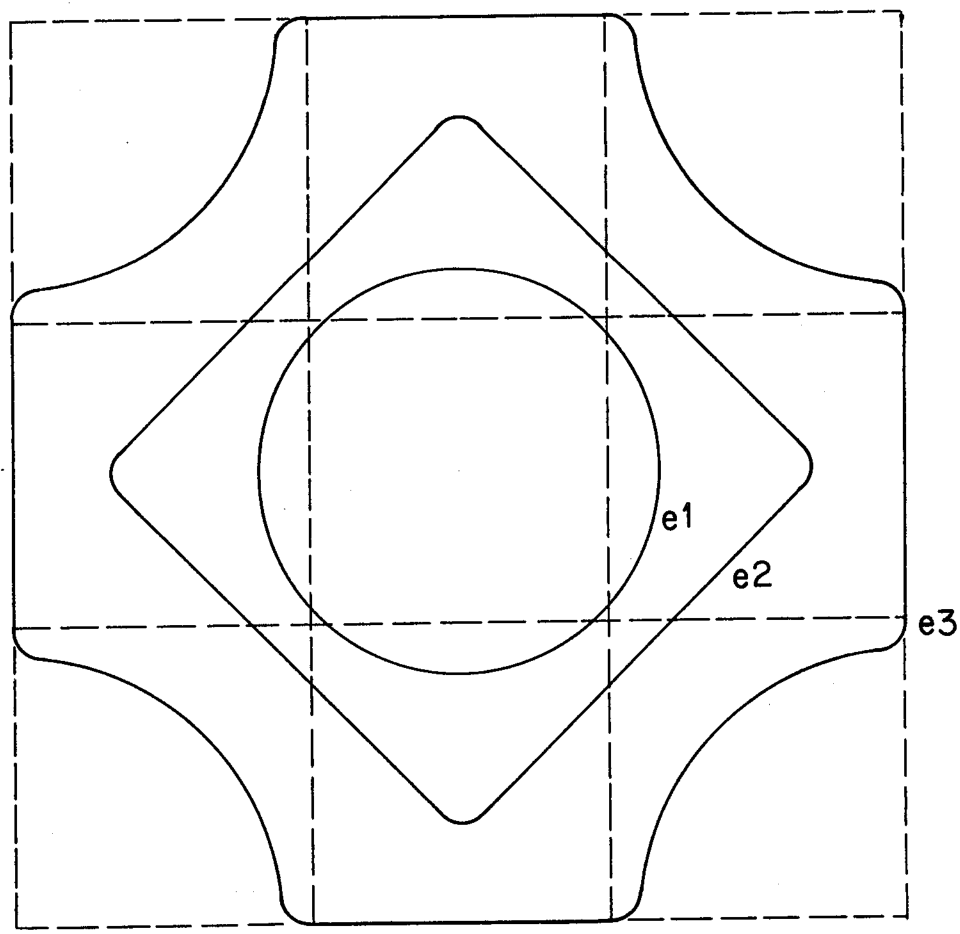
FIG. 3 is a diagram illustrating the variation of developed image size with exposure dosage at a fixed develop time.

The choice of exposure level versus image size is illustrated by the graph in FIG. 2. The graph indicates that a 4/14 of nominal exposure level produces a 1.25 micron dimension pattern from a 3.75 × 3.75 micron exposure. The size can be graded by varying the exposure level to develop various special shapes within the 3.75 × 3.75 micron exposed shape which do not coincide with the grid as illustrated in FIG. 3 where $e_1$, to $e_3$ indicate increasing exposure dosages.

While in this example each reduced exposure is at the same dosage level, it is, of course, possible to further tailor the shape and size by varying the exposure levels within the shape.

EXAMPLE 2

Figure 4:
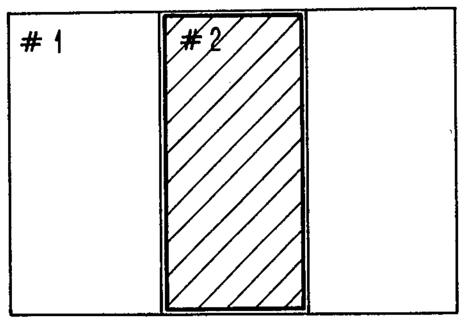
FIG. 4 is a diagram illustrating a developed image having a width which is smaller than the beam size formed by the process of the invention.

Resist coated wafers similar to that of Example 1 are exposed to achieve a 1.25 micron × 2.50 micron rectangle by exposing this shape as the intersection of two spots with the second spot being moved ½ of the spot width along the grid to the right as illustrated in FIG. 4. In order to develop only the shaded area when the singly exposed shapes in the remainder of the resist pattern are fully developed, the exposure of the overlapping spots is reduced to about ½ of the normal exposure time or dosage.

The foregoing has described a process for achieving developed shapes which vary from the grid pattern and which can be smaller than the beam size. This is significant in that it allows one to not only carefully control the shapes of images which are developed in the resist pattern but it allows one to obtain high through puts in large writing fields which are normally fixed on some ratio of the spot size. By using a large spot to fill the major portion of written patterns while allow small shapes to still be formed, optimum resolution and through put are acheived.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. In a process of forming a patterned resist image on a substrate, the process including the steps of:

forming a layer of resist material, which becomes more soluble in a developer when struck by electrons, on the substrate;

exposing the layer to a scanning beam of electrons to form a pattern of exposed shapes, the beam having a fixed spot size which is moved step-wise on a two dimensional grid whose grid size is a fraction of the spot size; and developing a patterned resist image by removing the resist material in the exposed shapes with a developer; the improvement which comprises forming first exposed shapes in the layer with a series of a non-overlapping exposures each at a first exposure dosage and forming a second exposed shape in the layer with multiple overlapping exposures, with each overlapping exposure being at a dosage less than said first exposure dosage; and then developing the patterned resist layer with a developer to completely remove the resist in the first exposed shapes down to the substrate while at the same time removing only a portion of the resist in the second exposed shape down to the substrate.

2. The process of claim 1 wherein the exposure dosage of the overlapping exposures is chosen so that the portion of the resist in the second exposed shape which is removed does not correspond to the grid.

3. The process of claim 1 wherein the exposure dosage of the overlapping exposures is chosen so that the portion of the resist in the second exposed shape which is removed is smaller than the spot size.

* * * * *